(12) United States Patent
Khatuntsev

(10) Patent No.: US 11,399,437 B2
(45) Date of Patent: Jul. 26, 2022

(54) METHOD FOR MANUFACTURING ELECTRONICS WITHOUT PCB

(71) Applicant: Nikolay V. Khatuntsev, Pleasanton, CA (US)

(72) Inventor: Nikolay V. Khatuntsev, Pleasanton, CA (US)

( * ) Notice: Subject to any disclaimer, the term of this patent is extended or adjusted under 35 U.S.C. 154(b) by 136 days.

(21) Appl. No.: 16/794,234

(22) Filed: Feb. 19, 2020

(65) Prior Publication Data
US 2020/0315024 A1     Oct. 1, 2020

Related U.S. Application Data

(60) Provisional application No. 62/823,665, filed on Mar. 26, 2019.

(51) Int. Cl.
| | | |
|---|---|---|
| *H05K 3/10* | (2006.01) | |
| *B33Y 80/00* | (2015.01) | |
| *H05K 1/02* | (2006.01) | |

(52) U.S. Cl.
CPC .............. *H05K 3/108* (2013.01); *B33Y 80/00* (2014.12); *H05K 1/0296* (2013.01); *H05K 3/103* (2013.01); *H05K 2201/10977* (2013.01)

(58) Field of Classification Search
CPC ...... H05K 3/108; H05K 3/0014; H05K 3/103; H05K 3/107; H05K 2201/10977; H05K 3/4697; H05K 2203/0126; H05K 2203/128; H05K 3/3468; B33Y 80/00; Y10T 29/4913; Y10T 29/49144; Y10T 29/49146
USPC ........................................... 29/832, 840, 841
See application file for complete search history.

(56) References Cited

U.S. PATENT DOCUMENTS

| | | | | |
|---|---|---|---|---|
| 7,231,276 | B2 * | 6/2007 | Silverbrook | H05K 3/125 700/119 |
| 7,886,150 | B2 * | 2/2011 | Stollon | G01R 31/318544 713/171 |
| 10,462,907 | B2 * | 10/2019 | Lewis | H05K 3/125 |
| 10,879,151 | B2 * | 12/2020 | Parekh | H01L 23/473 |

\* cited by examiner

*Primary Examiner* — Donghai D Nguyen

(57) ABSTRACT

The present invention comprises a method of manufacturing electronics without PCBs and an apparatus for manufacturing electronics without PCBs.

10 Claims, 21 Drawing Sheets

METHOD FOR MANUFACTURING ELECTRONICS WITHOUT PCB

CROSS-REFRENCE TO RELATED APPLICATION

This application incorporates by reference, and claims priority to and the benefits of, U.S. Provisional Patent Application No. 62/823,665, filed on Mar. 26, 2019.

FIELD OF THE INVENTION

The present invention relates to novel method of designing and manufacturing of electronics without PCBs. More particularly, the invention relates to method of simultaneous manufacturing of electronic devices and its enclosures as a single process by extruding conductive and non-conductive materials while embedding electronic components.

BACKGROUND OF THE INVENTION

Current process of designing electronics or electronic devices involves electrical engineering for designing schematic and PCB (Printed Circuit Board) layout and mechanical engineering for enclosure design. Manufacturing process includes fabrication of PCB, PCB assembly process (component soldering), fabrication of enclosure by various methods, testing, and optionally programming as depicted on FIG. 1a. Manufacturing process is usually time consuming and involves setup cost. Because of the setup cost, electronic products with low volume might cost several times more than the cost of parts it is made from.

PCB layout design might be challenging if there are many signal traces, many components and there is not enough empty space left on PCB with limitation on number of copper layers. While increasing number of copper layers makes it easier to route traces, it also makes PCB more expensive.

One of the currently used methods to fabricate enclosures is 3D printing. 3D printing is a known process where parts are fabricated on a layer by layer basis.

3D printers and 3D printing process with extrusion of melted thermoplastic or metals are well known. Pick-and-place machines that places electronic component to PCBs before reflow process are well known. 3D printers with two or more extruders for different materials also exist. There are printers that can print PCBs with a conductive ink (e.g. U.S. Pat. No. 9,887,356 B2, US patent application US 2013/0170171 A1). There is a patent U.S. Pat. No. 9,414,501 B2 that describes embedding a wire into plastic for creating electric circuit traces.

BRIEF SUMMARY OF THE INVENTION

The present invention comprises a new method of designing and manufacturing electronics depicted on FIG. 1b and an apparatus for 3D manufacturing with exemplary embodiments depicted on FIG. 2 and FIG. 3. The new design method replaces an old design method of separate PCB design (component placement and trace routing) and separate mechanical design of enclosure, by integrating it all in one process. The new design method comprises mechanical design of outer shape or physical features of an electronic device, electronic component placement in 3D space within the whole shape of a product, and automatic or manual conductive traces routing in 3D space.

The invented method saves time and reduces cost of manufacturing, while the overall design time stays approximately the same.

The invented apparatus combines 3D printer and pick-and-place machine with additional functional parts to enable manufacturing electronic devices with conductive and non-conductive material while embedding electrical components and creating electrical connection (traces) between electrical components. This enables to manufacture electronics without PCBs.

The invented apparatus manufactures electronics by extruding layers of non-conductive material to create shape of a product with cavities for electrical components, pick and place components into corresponding cavities, and extrude non-conductive and conductive materials on top of placed component to create electrical traces.

The main functional parts of invented apparatus are: mechanical support frame, moving head, building platform, processing unit, computer vision camera, non-conductive material extruder, conductive material extruder, pick-and-place mechanism, flux dispenser, mirror, flip mechanism, components reel feeder, components tray, stepper motors, vacuum pump, solenoid valve, heaters, fans, temperature sensors, endstop switches, communication interface with computer and with operator.

Proposed method and apparatus will be especially useful for quick-turn prototyping and low volume manufacturing, but it might be beneficial for high volume manufacturing as well.

DETAILED DESCRIPTION OF THE INVENTION

Figure 1A:
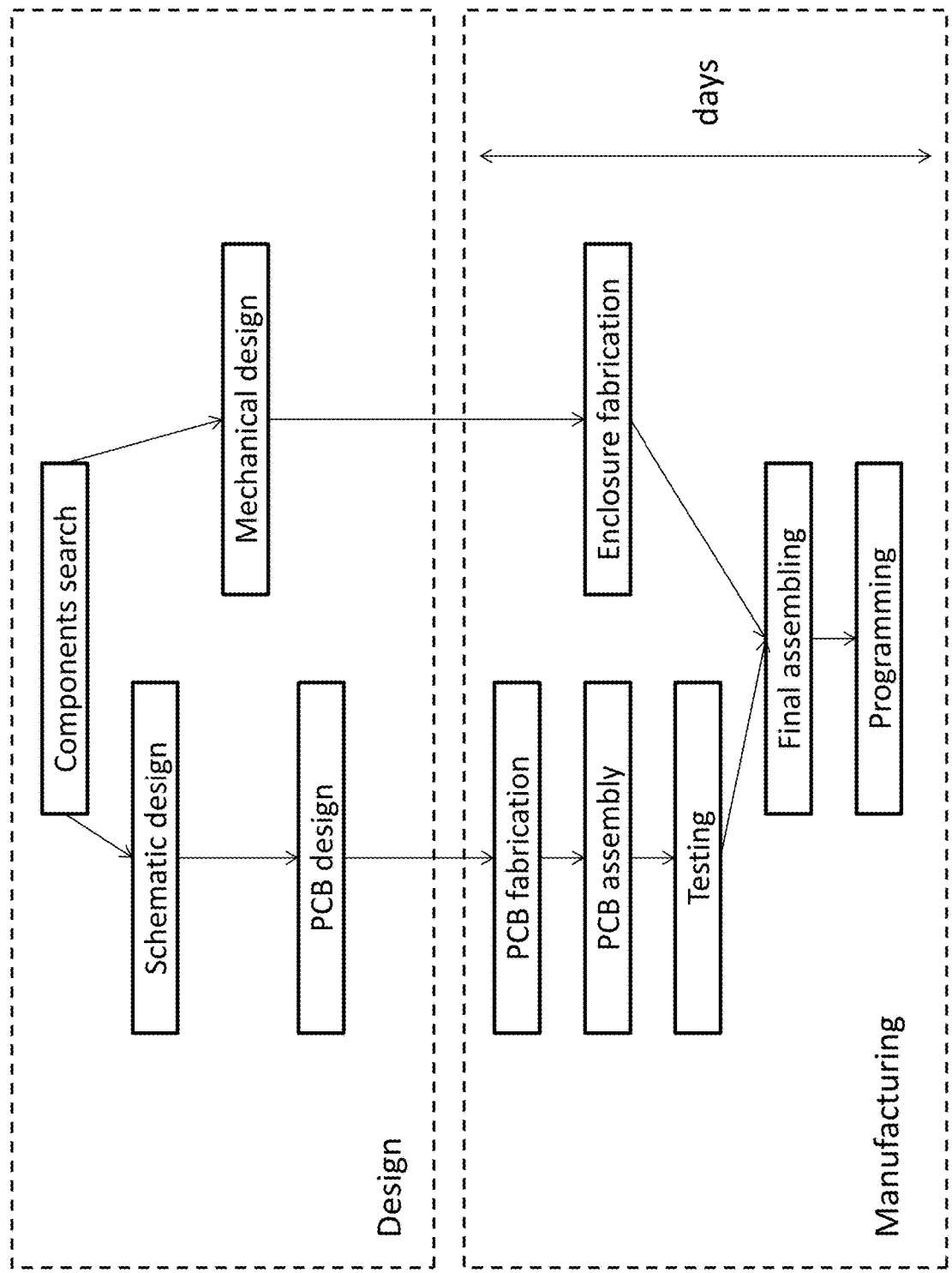
FIG. 1a shows the existing process of creating electronics with PCBs. It includes design and manufacturing steps.
Figure 1B:
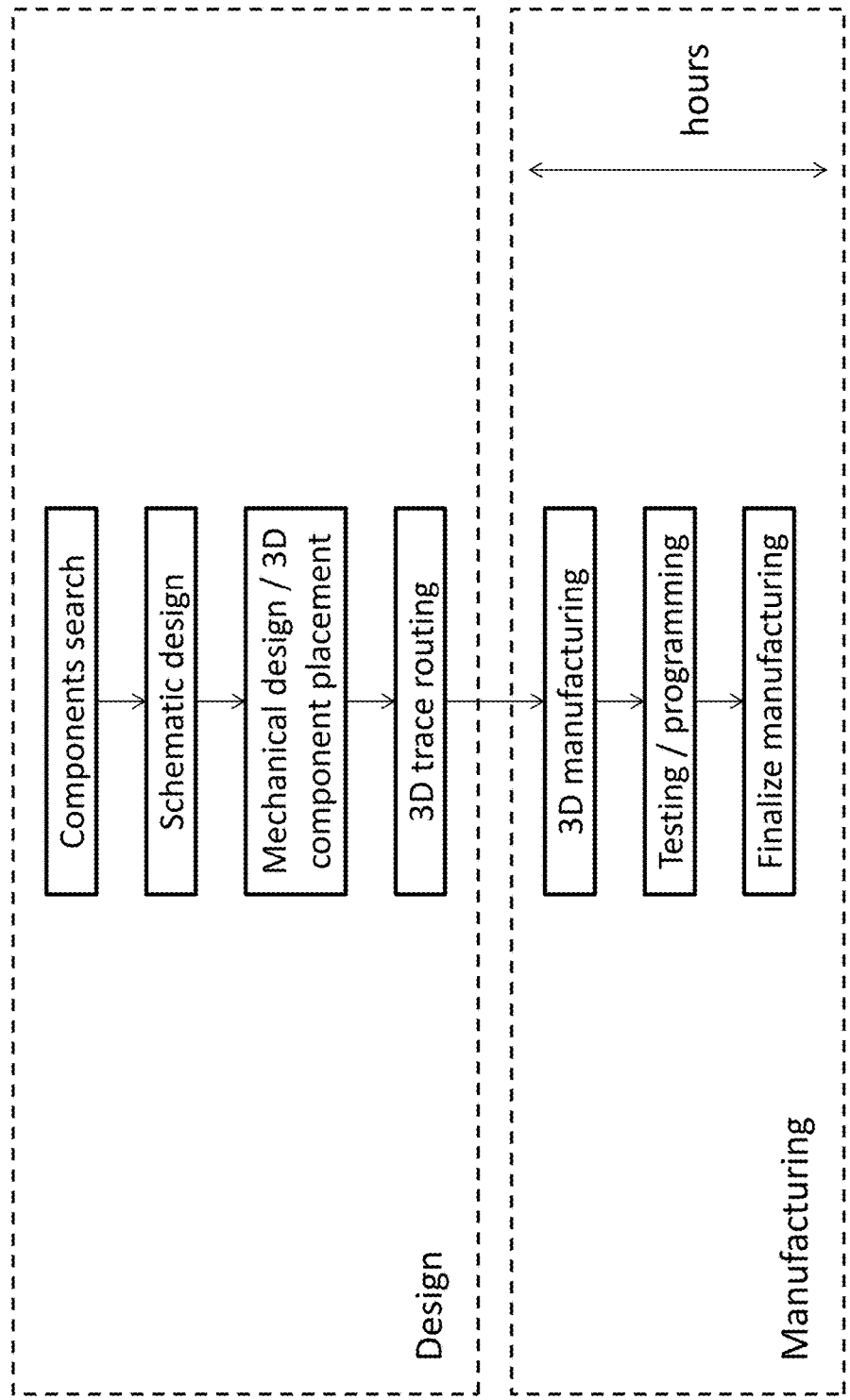
FIG. 1b shows the invented process of creating electronics without PCBs. It includes design and manufacturing steps.
Figure 2:
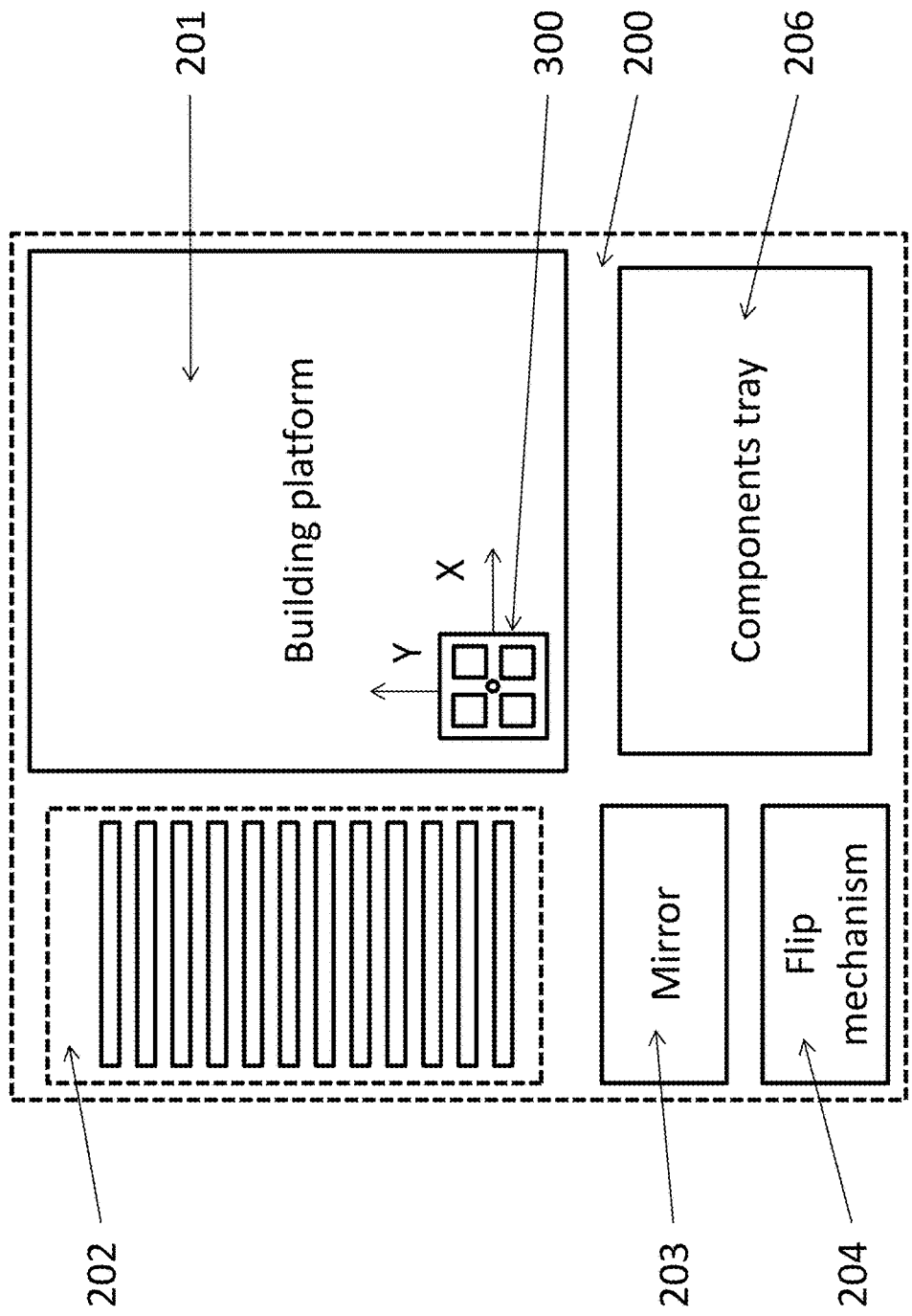
FIG. 2 depicts an example of locations of some functional parts in horizontal cross section within the reach of moving head.
Figure 3:
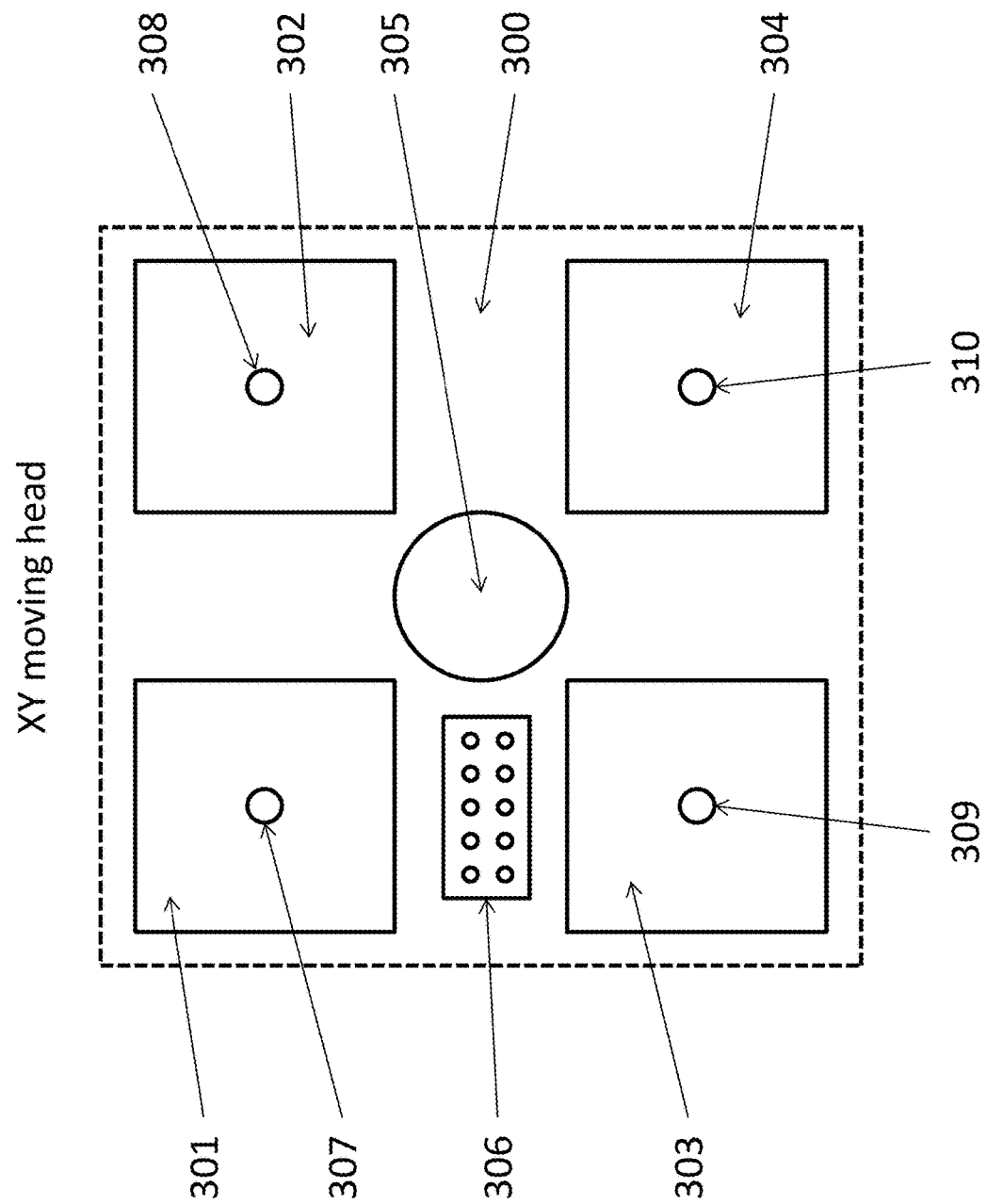
FIG. 3 depicts an example of locations of some functional parts of moving head in horizontal cross section.

As used herein electronics are electronic devices that powered-up by electricity, or using electricity or converting electricity.

As used herein components are electronic components or non-electronic components or other objects that can be placed and embedded into extruded objects.

As used herein PCB-less CAD software is software that can be used to design, simulate and create design files accordingly to the invented method of manufacturing electronics. The invented apparatus will use those files for actual manufacturing of electronics.

The invented method of manufacturing electronics comprises: designing schematic (with component search), 3D design of external appearance of an electronic device, 3D design of components placement within the shape of electronic device, automatic or manual 3D routing of traces, actual manufacturing and testing with invented apparatus.

The invented method uses traditional processes for component search and schematic design. Netlist and bill of material (BOM) are outputs of this step and needed for further design steps.

Designing 3D outer shape of an electronic product can be done in existing 3D CAD software or in PCB-less CAD software.

The next design step is internal placement of components. For this step 3D models of all components are needed. Component manufacturer might provide 3D model along with electronic component documentation. For transitional period while those 3D models are not available—the invented apparatus could be used to scan and create 3D models. PCB-less CAD software will allow designer to place 3D models of components manually or with some guidance inside the outer shape of electronic device.

PCB-less CAD software must ensure that components are not overlapping and there is enough space in between components and conductive contacts.

The proposed method works with SMD components or components that have all its contacts on a single imaginary plane on one side. Here are some examples of component packages that can be used with this method, but not limited to: rectangular shape (resistors, capacitors, diodes, . . . ), QFN, TQFP, BGA, . . . .

Once all the components are placed, designer can automatically or manually connect components contacts according to the netlist generated by schematic capture software. The routing of traces is done in 3D space which is less challenged in compare to PCB routing on limited number of copper layers. The traces can be within the outer shape of the device and not overlap with other components. Traces can have different thickness and might have different thickness along the trace. This allows creating traces that will match the required impedance.

Some surface area of designed electronic devices might be used for serialization during manufacturing. A special area is designated, and the serialization format is selected during the design step. At the manufacturing step the invented apparatus will put serialization mark such as bar-code, QR code, or human readable symbols. It might include serial number, timestamp, or other information that known during manufacturing process.

As used herein arranged test-points are plurality of conductive elements separated by non-conductive material and arranged in some pattern. Those conductive elements have electrical connection to the rest of the electrical circuitry for the purpose of probing, testing or programming.

If in-circuit programming or testing during manufacturing is needed, then arranged test-points could be placed in the model above the tested circuit, so they will be extruded after the circuit is ready for test.

Design footprint of test points must match footprint of testing/programming head 306 of manufacturing apparatus to be used. The apparatus might have many headers with various footprints, or design file might have just certain area without exact specification of footprint—the apparatus itself will generate this portion with matching to the available testing/programming head 306.

The PCB-less CAD software can model and match impedance by using properties of material to be extruded (conductivity of conductive material, dielectric constant of non-conductive material, etc. . . . ).

The result of the design process is a design file or files that contain the information about 3D components placement, 3D shape, and 3D traces. This information can be stored using volumetric pixels or triangulated surfaces (like in STL format).

In one embodiment the invented apparatus comprises: three dimensional moving building platform; stationary conductive and non-conductive material extruders; computer vision camera; pick-and-place mechanism for picking components.

In another embodiment the invented apparatus comprises: three dimensional moving head; conductive and non-conductive material extruders; computer vision camera; pick-and-place mechanism; stationary building platform.

In preferred embodiment the invented apparatus comprises: supporting frame; vertically (Z) moving building platform 201 with horizontally (XY) moving head 300; mirror 203; flip mechanism 204; components tray 206; components reel feeder 202; processing unit; stepper motors; vacuum pump; power supply; vacuum solenoid valve; heaters; fans; temperature sensors; endpoint switches; user interface. The moving head itself comprises: conductive material extruder 301; non-conductive material extruder 302; pick-and-place mechanism 303; computer vision camera 305; testing/programming head 306.

Accessible area 200 of moving head 300 is bigger than building platform 201. Moving head 300 should have access to the following components of the device, but not limited to: building platform 201, components reel feeder 202, components tray 206, flip mechanism 204, and mirror 203.

Stepper motors controlled by processing unit are associated with certain degrees of freedom. For XY moving head 300 there are two motors that move head along X and Y axis. Building platform 201 has another stepper motor that can move building platform 201 up and down. On the moving head 300 in pick-and-place mechanism 303 there are two designated motors which can rotate vacuum nozzle 309 and a component for at least 360 degrees, and also move up and down. Another motor is designated to flux dispenser 304 that controls dispensing, and another that moves it up and down. Other motors are designated to material extruders 301 and 302.

Building platform 201 is used to hold deposited material from extruder nozzles 307, 308 to create new electronic devices, to hold the electronic device while placing components or while testing or programming. The building platform 201 has a heater to provide better adhesion during the first layer extrusion and also to eliminate material wrapping by reducing temperature gradient of electronic devices. The building platform 201 might be automated to automatically remove the manufactured electronic device and prepare the building platform 201 for next manufacturing process. In this case continuous manufacturing process is possible.

Components reel feeder 202 is needed to provide access for pick-and-place mechanism 303 to components supplied in reels. It also contains a mechanism to move each reel individually as components being picked out.

Components tray 206 is needed to provide access for pick-and-place mechanism 303 to components supplied in trays or in packages other than reels. Components tray 206 is also used to hold components for creating 3D models. Components tray 206 is also used for temporary components storage.

Flip mechanism 204 is used to turn components upside-down, because components are usually placed in reels with contacts side down which is convenient for placement on PCBs. Invented method of manufacturing electronics requires components to be turned upside down.

Flip mechanism 204 comprises motor or actuator or plurality of those with two surfaces that can rotate 180 degrees along a single horizontal axis. Component first is placed by pick-and-place mechanism 303 on one surface, then it is covered with opposite surface by rotating it by 180 degrees, and then all surfaces and a component in between are rotated 180 degrees back, then upper surface rotate 180 degrees back to initial position. The electronic component now is placed on other surface in upside down orientation, where it could be picked by pick-and-place mechanism 303.

Mirror 203 is used in conjunction with computer vision camera 305 to detect and estimate orientation and offset of components relative to vacuum nozzle 309. This allow precise placement of the components into prepared component cavities. Also mirror 203 is used in conjunction with computer vision camera 305 to create 3D models of components. Also mirror 203 is used in conjunction with computer vision camera 305 to calibrate position of tips of the nozzles 307, 308, 309, 310 and testing/programming head 306.

In one embodiment mirror 203 is a flat mirror perpendicular to vacuum nozzle 309. In other embodiment mirror 203 is a combination of two or more tilted flat mirrors. Plurality of mirrored surfaces will give plurality of view angles to the components for the computer vision camera 305.

Computer vision camera 305 direct view and reflected view from mirror 203 of components both used for 3D model reconstruction. Vacuum nozzle 309 also has two degrees of freedom relative to moving head. Vacuum nozzle 309 can rotate and move up and down. Those two degrees of freedom are used for capturing more than one view of a component held at vacuum nozzle 309. Then processing unit using plurality of images at different position and orientation, reconstructs 3D model with computer vision algorithm (virtual stereo depth reconstruction or others). Computer vision camera 305 has illuminator to highlight field of view.

Flux dispenser 304 is used to dispense flux to contacts of components. Flux is needed to clean the surface and to provide better solder contact. Flux dispenser 304 might be a flux pen, a container with flexible tubing, electronic valve and a nozzle tip, or a container with flexible tubing, nozzle tip with spring-loaded ball valve. Flux dispenser 304 should have a motor or actuator to move nozzle up and down.

Conductive material extruder 301 is used to create conductive traces, and to electrically connect components. Conductive traces could have different shapes and different/variable cross-sections. More than one passes of extrusion might be needed to create wider trace. Conductive material extruder comprises stepper motor to feed the solder wire, heater to melt the solder, nozzle to extrude solder. Extruder nozzle should not react with solder, so in preferred embodiment it is made out of stainless steel, and not brass.

Non-conductive material extruder 302 is used to create support for the components and the rest of electronic device. Non-conductive material extruder comprises stepper motor to feed the thermoplastic filament, heater to melt the thermoplastic filament, nozzle to extrude thermoplastic filament.

It is important to keep only the currently used nozzle at its lowest point of the moving head, while other nozzles are lifted up. Combination of motors and actuators can be used to move nozzles up and down, so they will not collide with already extruded layers. In one embodiment each independent mechanism on moving head 300 has its own motor or actuator to move it up and down. In another embodiment moving head has selector mechanism that lowers only one nozzle at a time.

Moving head 300 of the invented apparatus is substantially heavier that moving head of a regular 3D printer, so care should be taken designing frame and gantry to avoid excessive deflection.

Manufacturing process is started with sending or transferring design file or files to the invented apparatus. Design files could be transferred to the invented apparatus via Ethernet or Wi-Fi, via USB port directly from computer or thumb drive, or via memory card. At the next step, processing unit of the invented apparatus analyzes the design file, checks the presence of components needed for manufacturing, and prepares information about each layer. At the next step building platform heater, and extruder heaters are heated and components on components tray 206 are analyzed with computer vision camera 305. Processing unit might decide to use flip mechanism 204 for further component analysis and preparation for manufacturing (turning components upside down, while keeping information about the part and its location on a components tray 206).

Figure 4A:
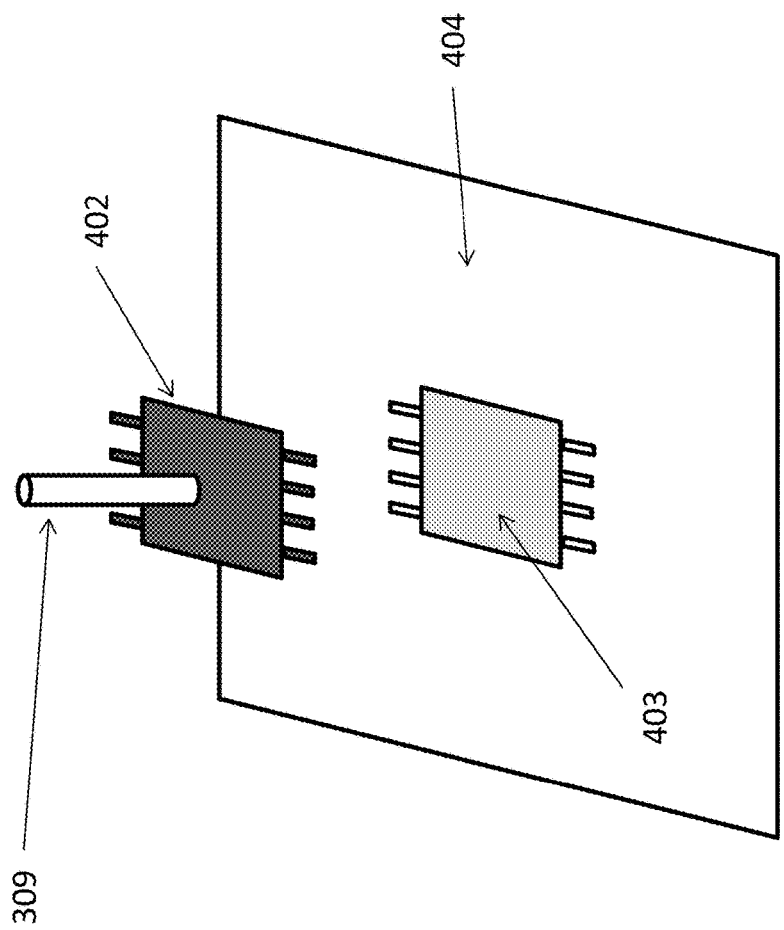
FIG. 4a shows an example of component placement into prepared cavity.
Figure 4B:
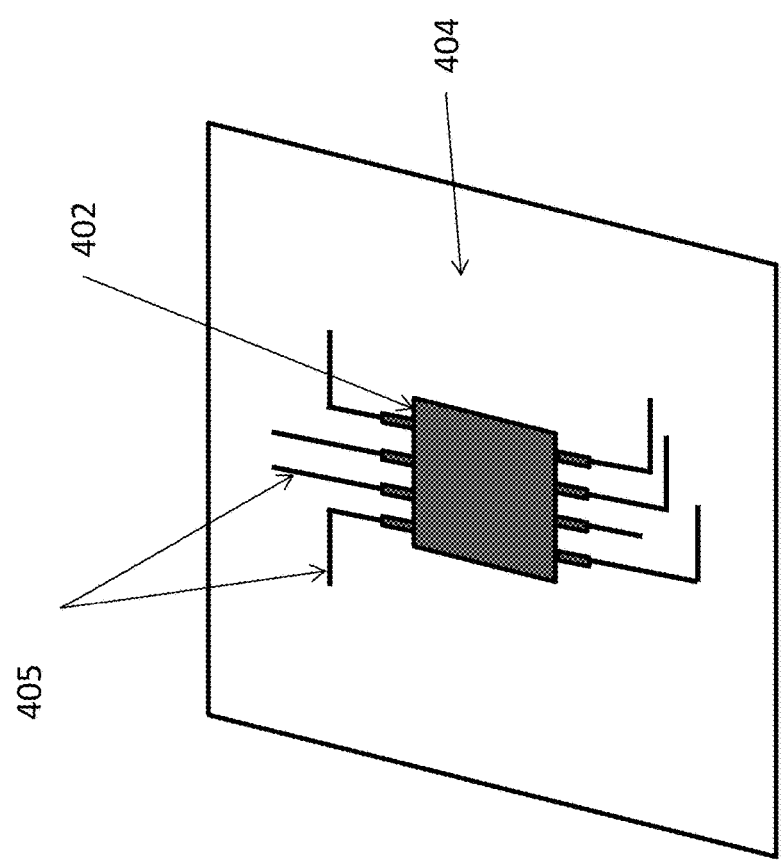
FIG. 4b shows an example of placed component and extruded conductive traces.
Figure 5:
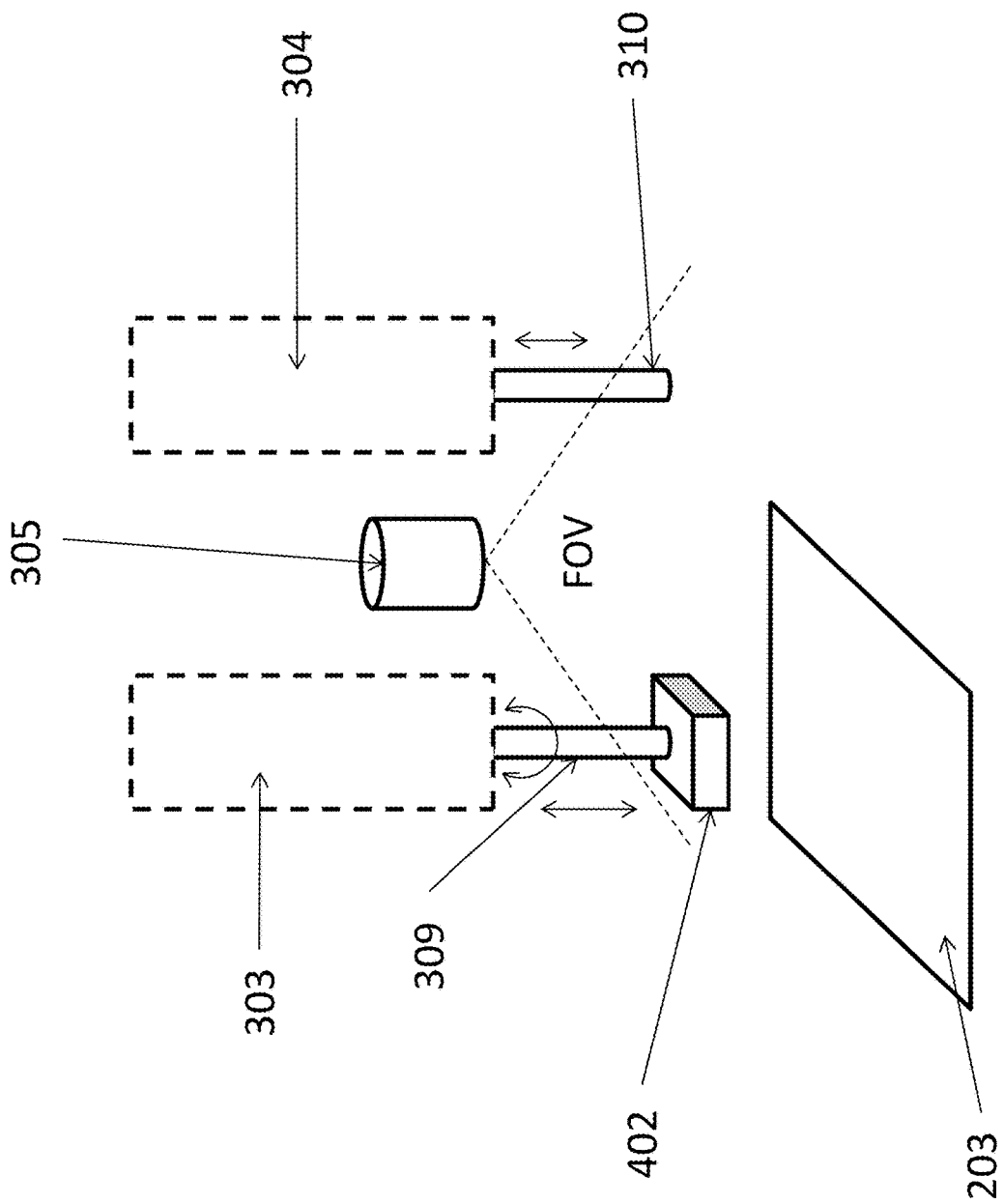
FIG. 5 shows an example of functional parts of pick-and-place mechanism, flux dispenser, computer vision camera and a mirror.
Figure 6A:
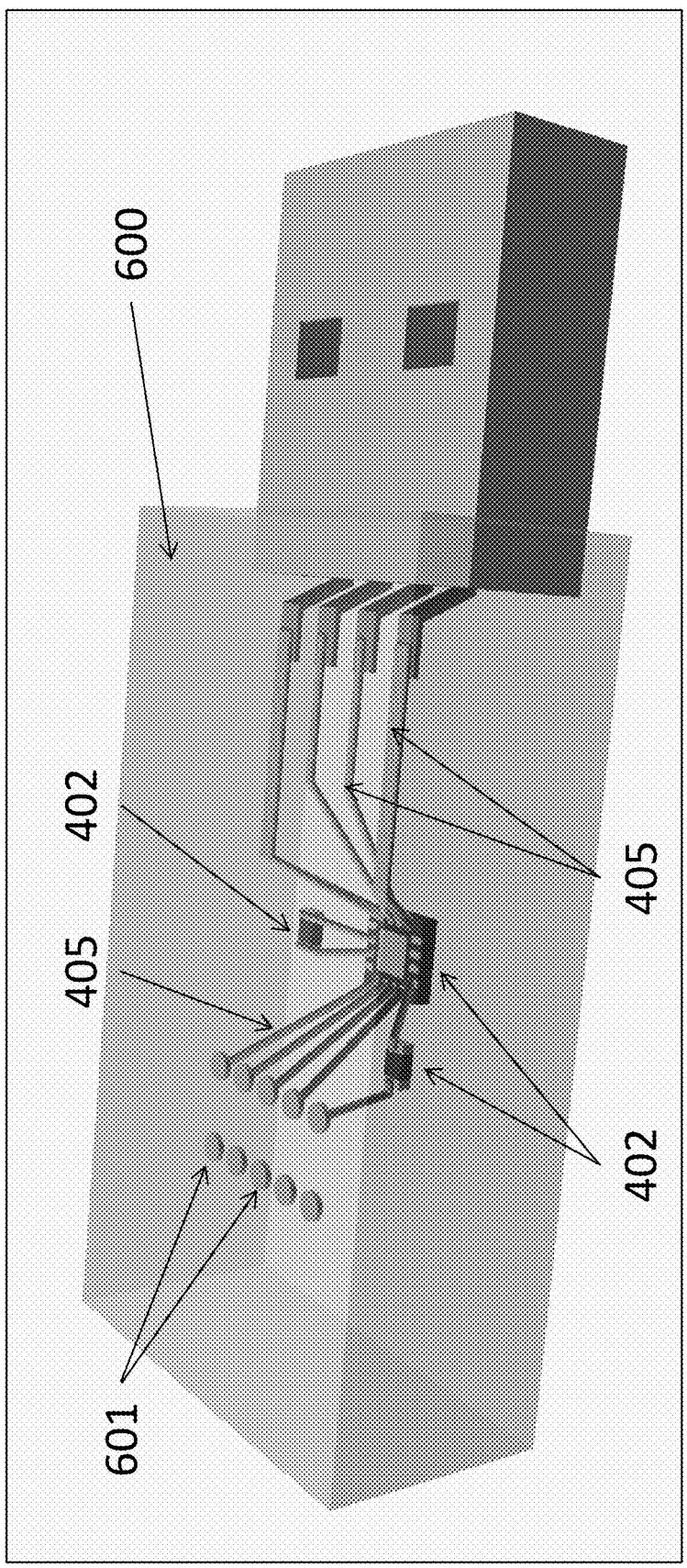
FIGS. 6a, 6b, 6c show different views of example of manufactured electronic device with transparent non-conductive material.
Figure 6B:
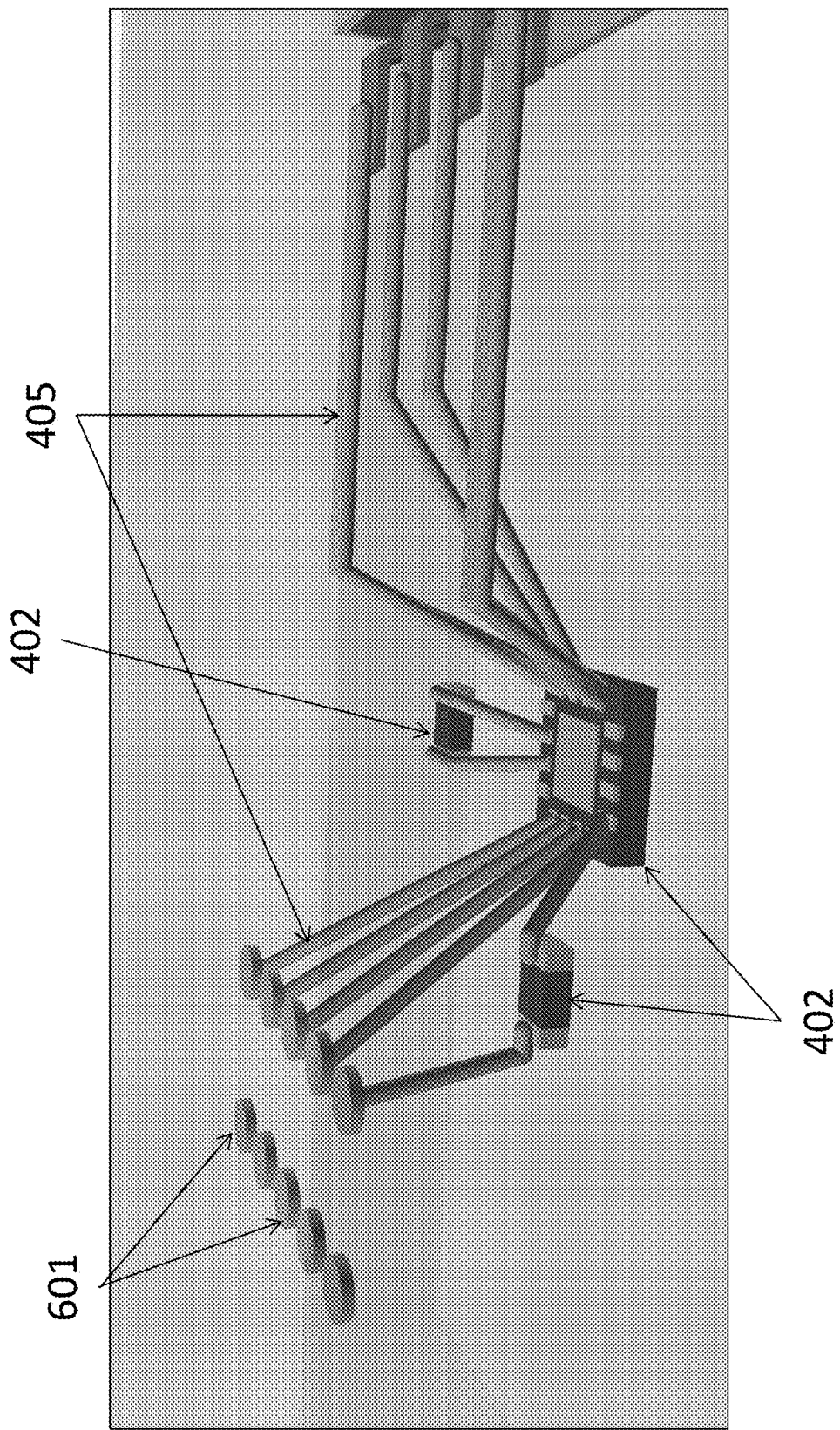
Figure 6C:
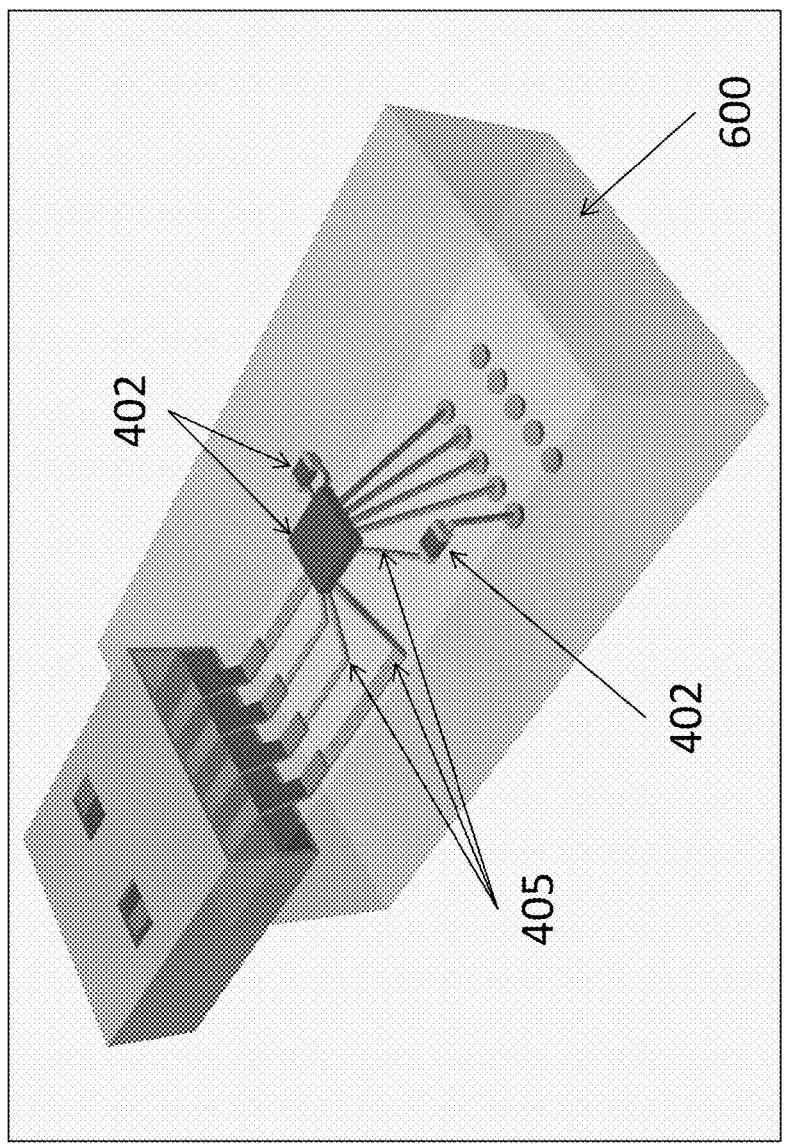
Figure 7A:
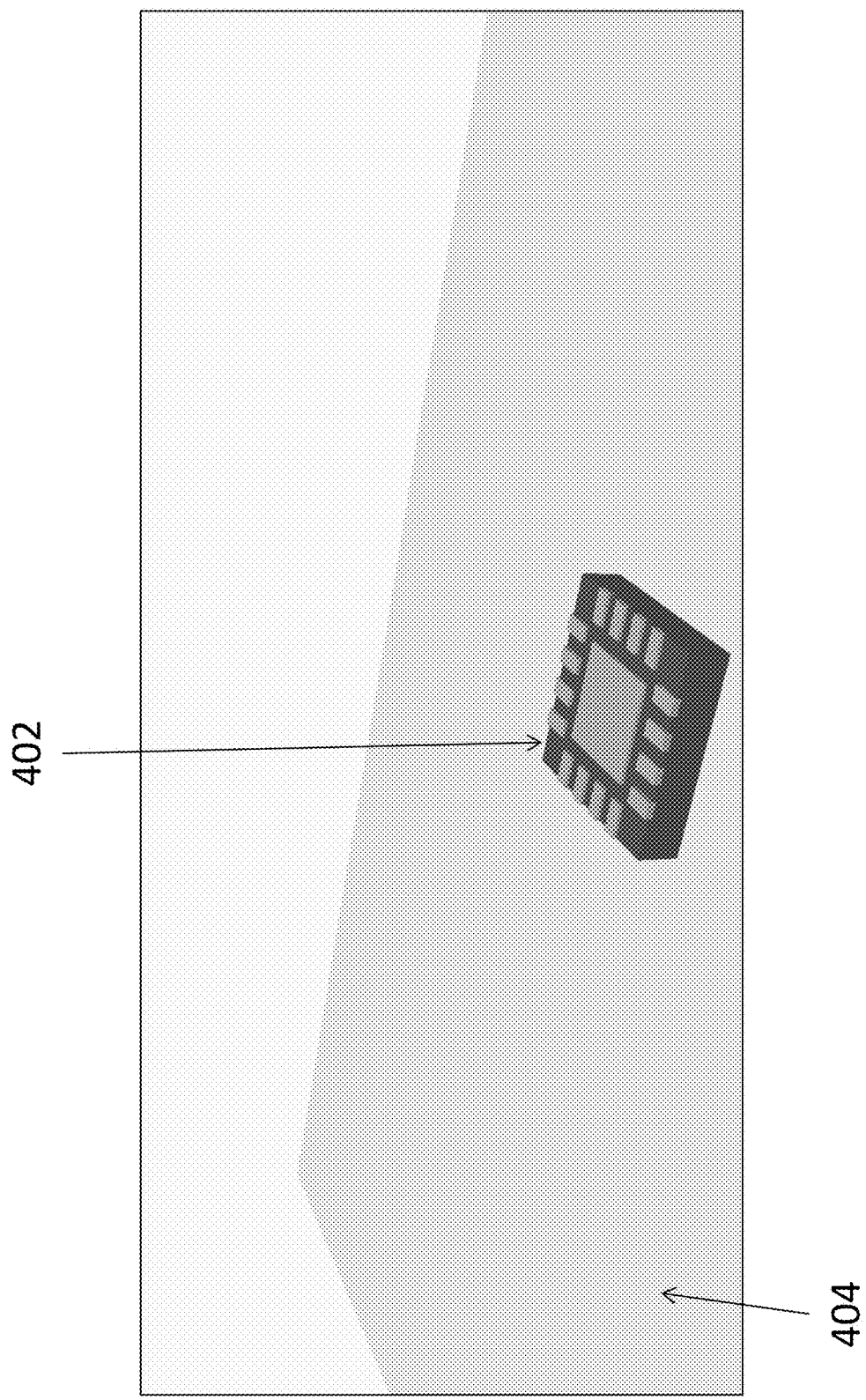
FIGS. 7a, 7b, 7c, 7d, 7e, 7f, 7g, and 7h show different stages of manufacturing electronic device.
Figure 7B:
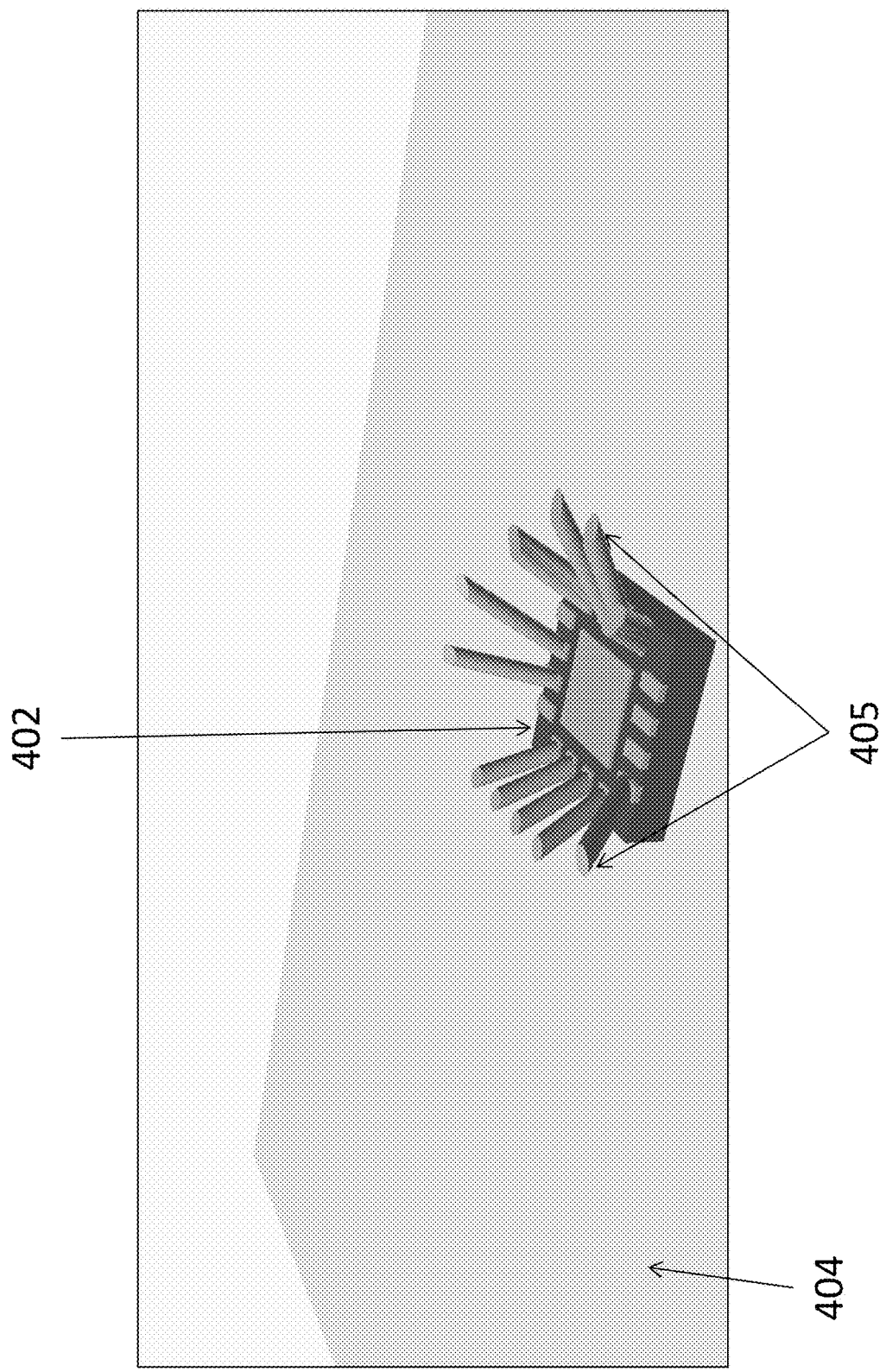
Figure 7C:
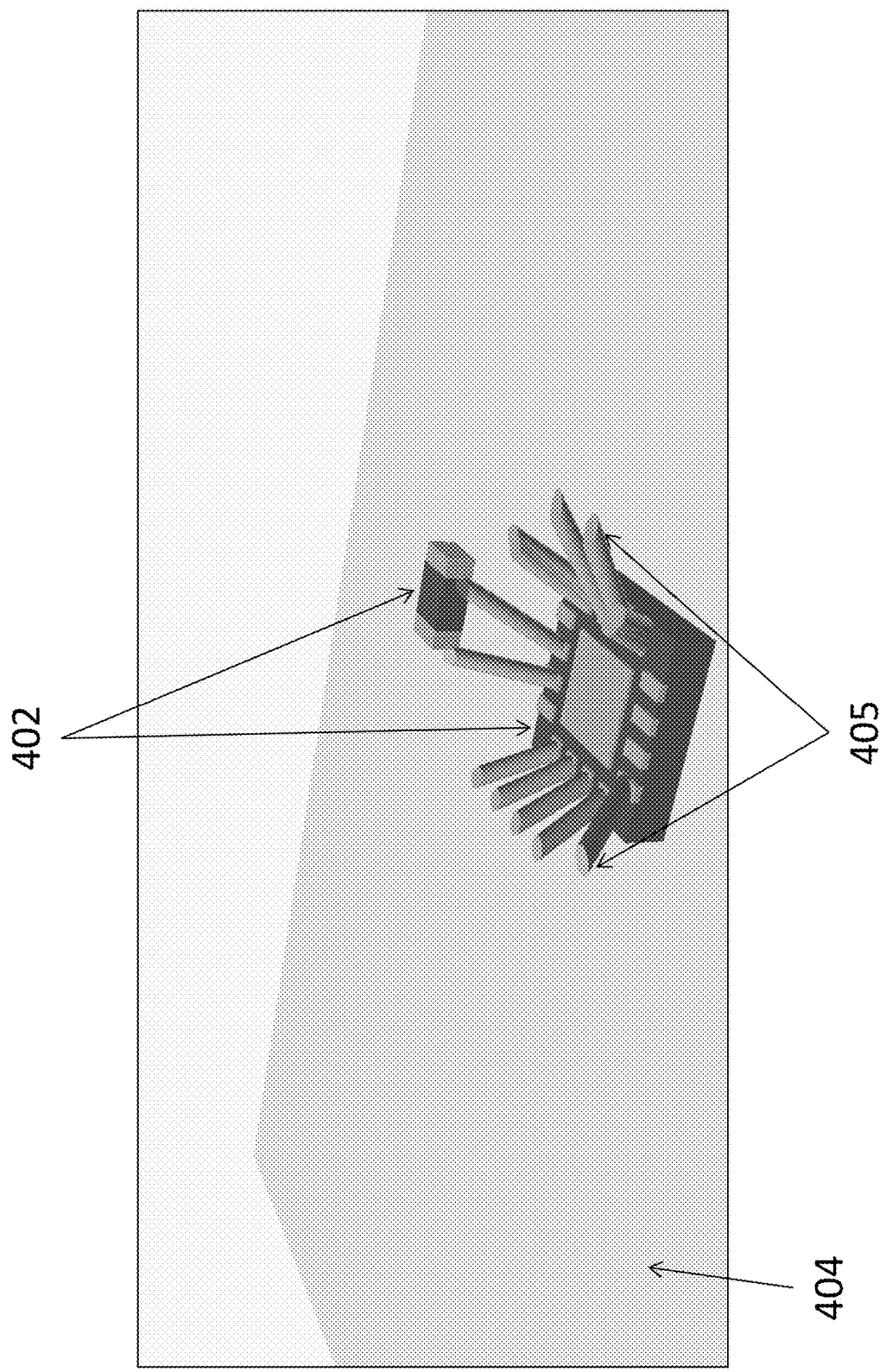
Figure 7D:
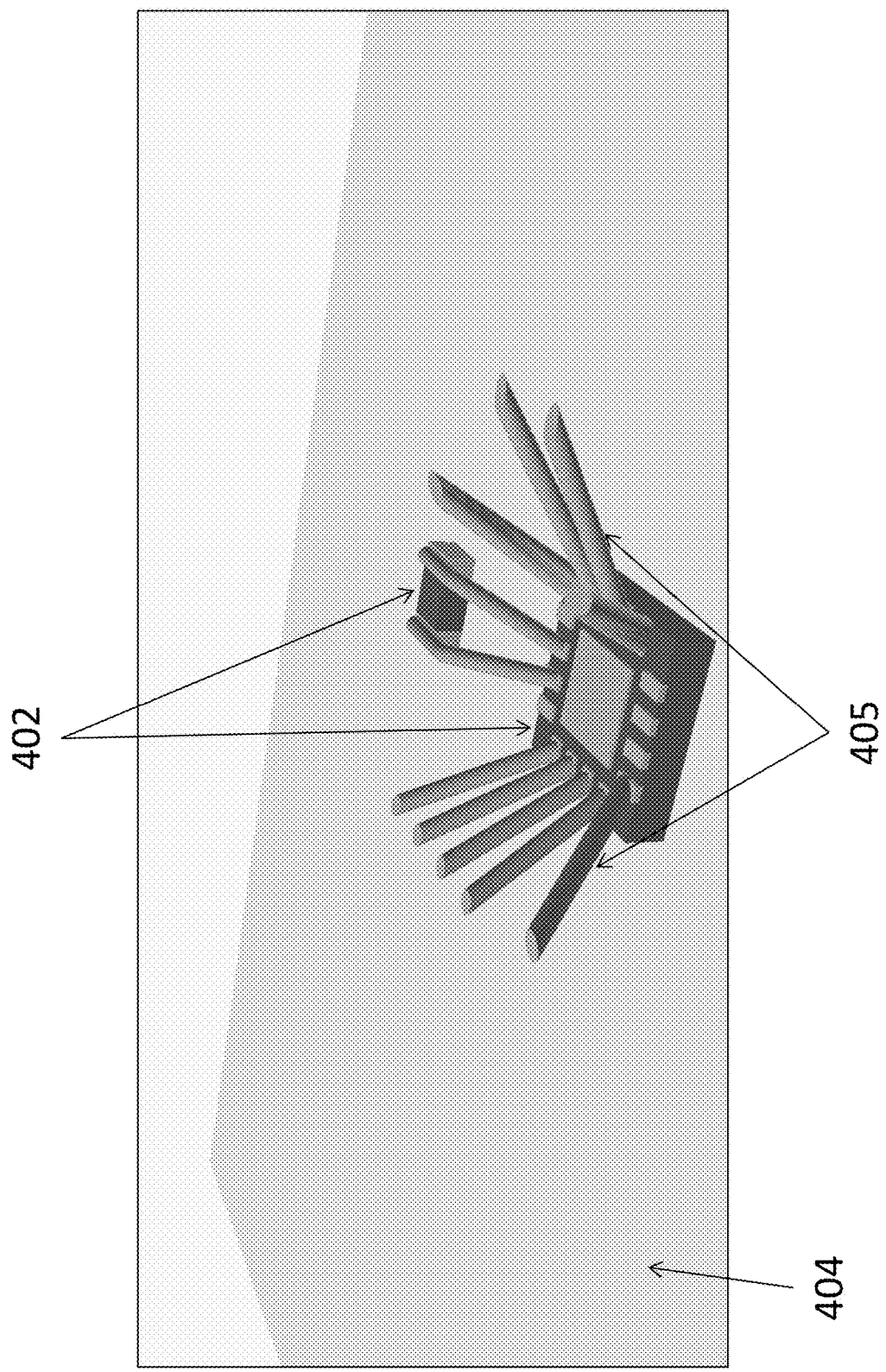
Figure 7E:
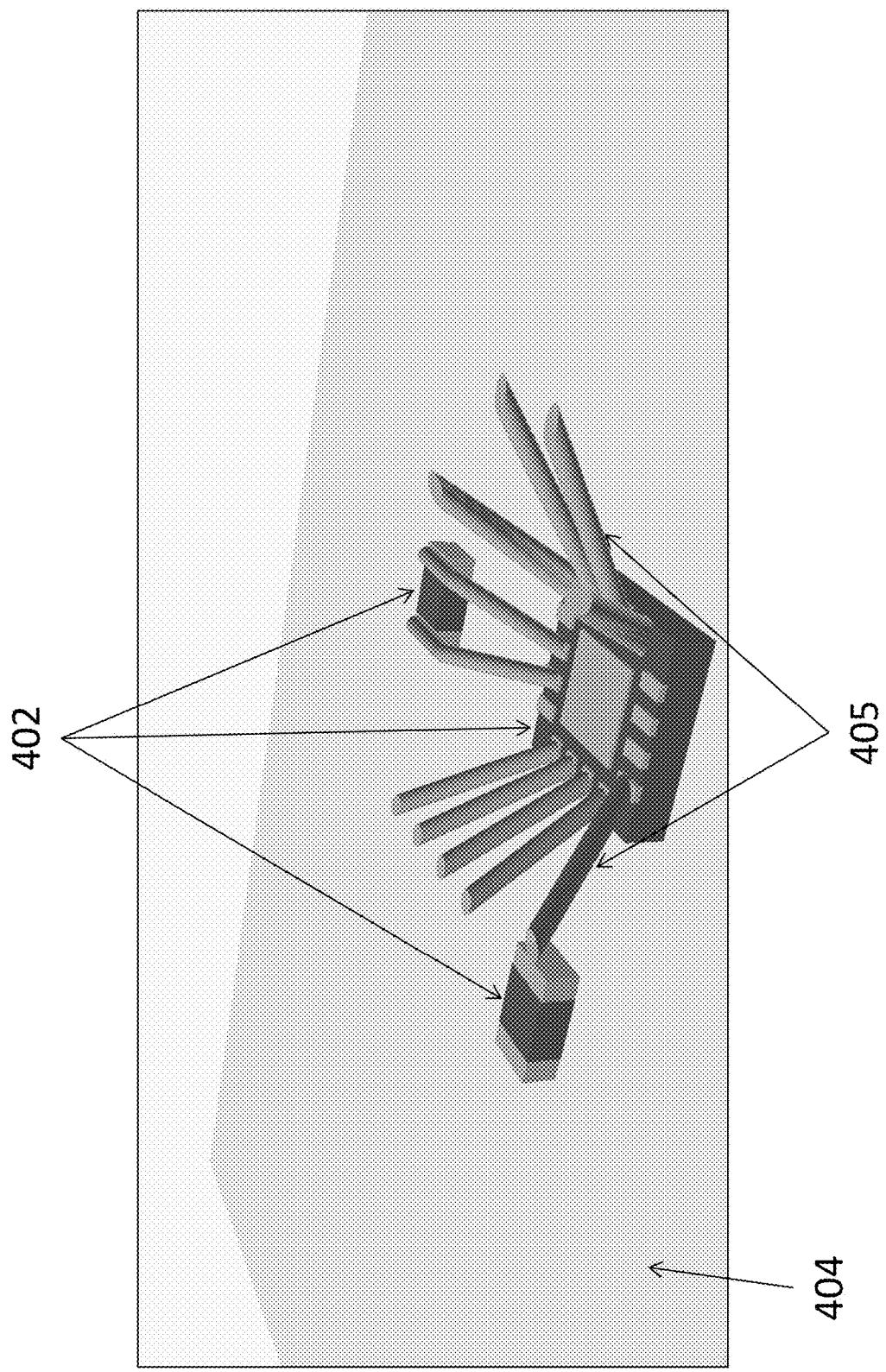
Figure 7F:
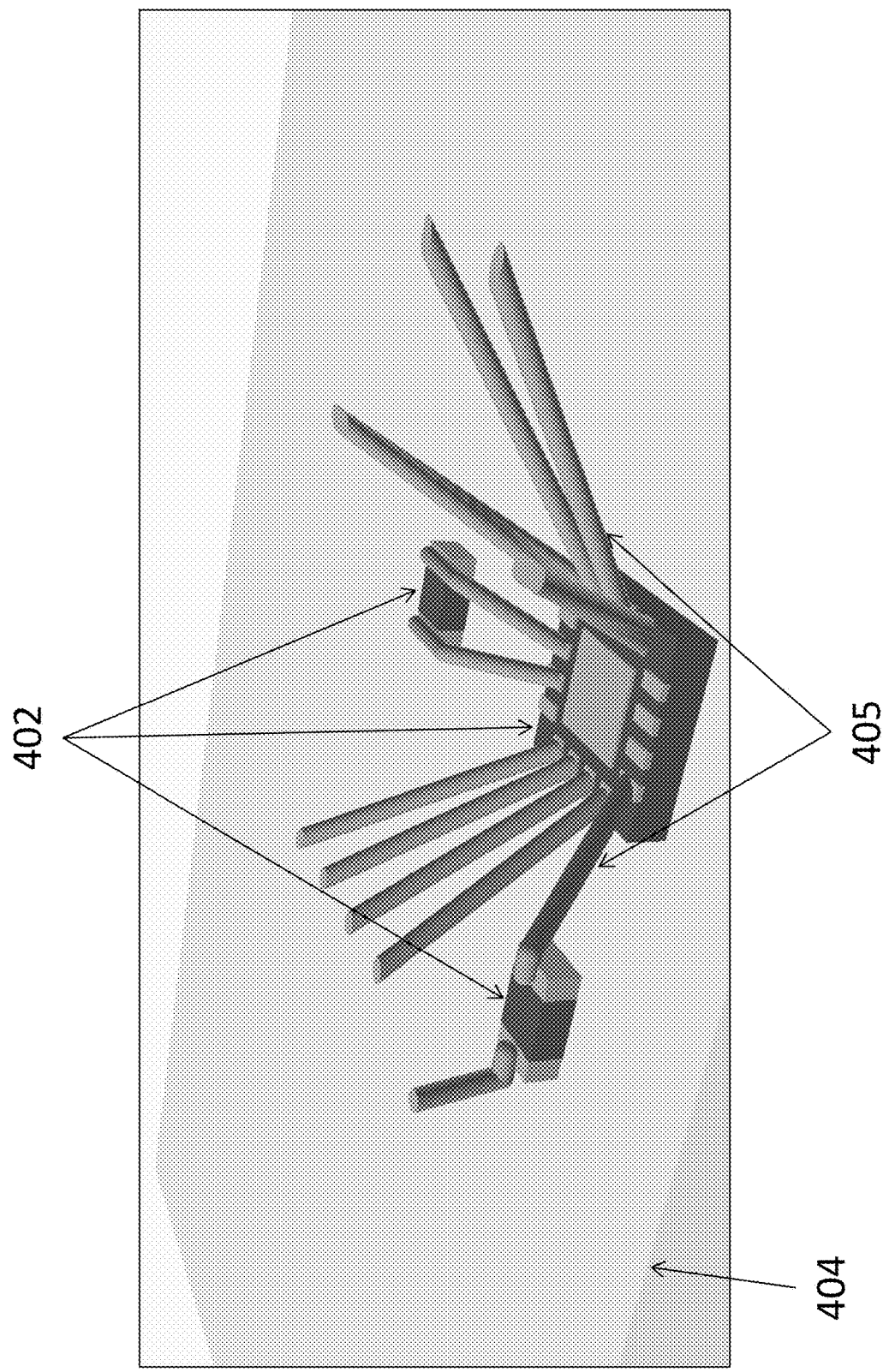
Figure 7G:
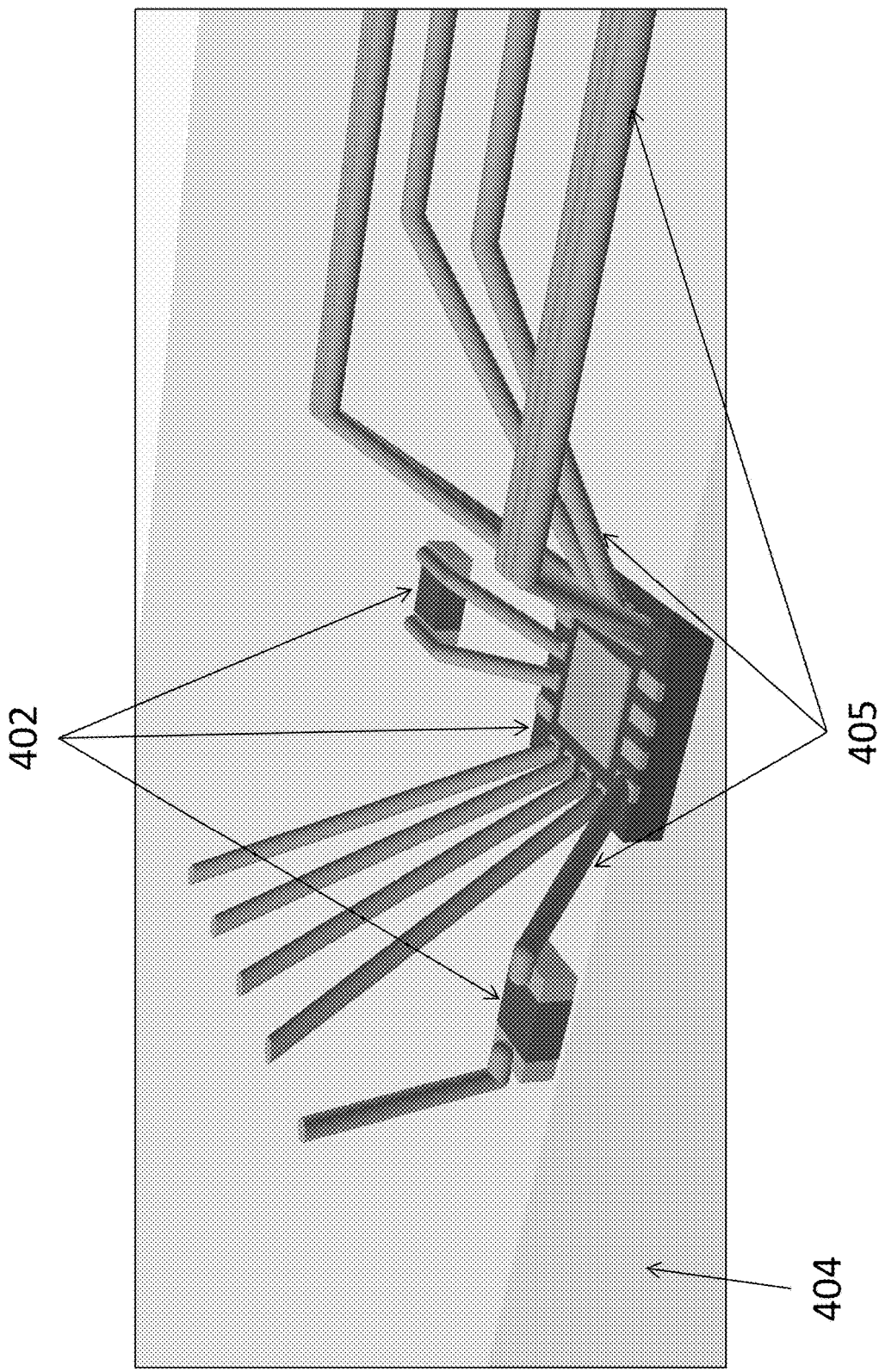
Figure 7H:
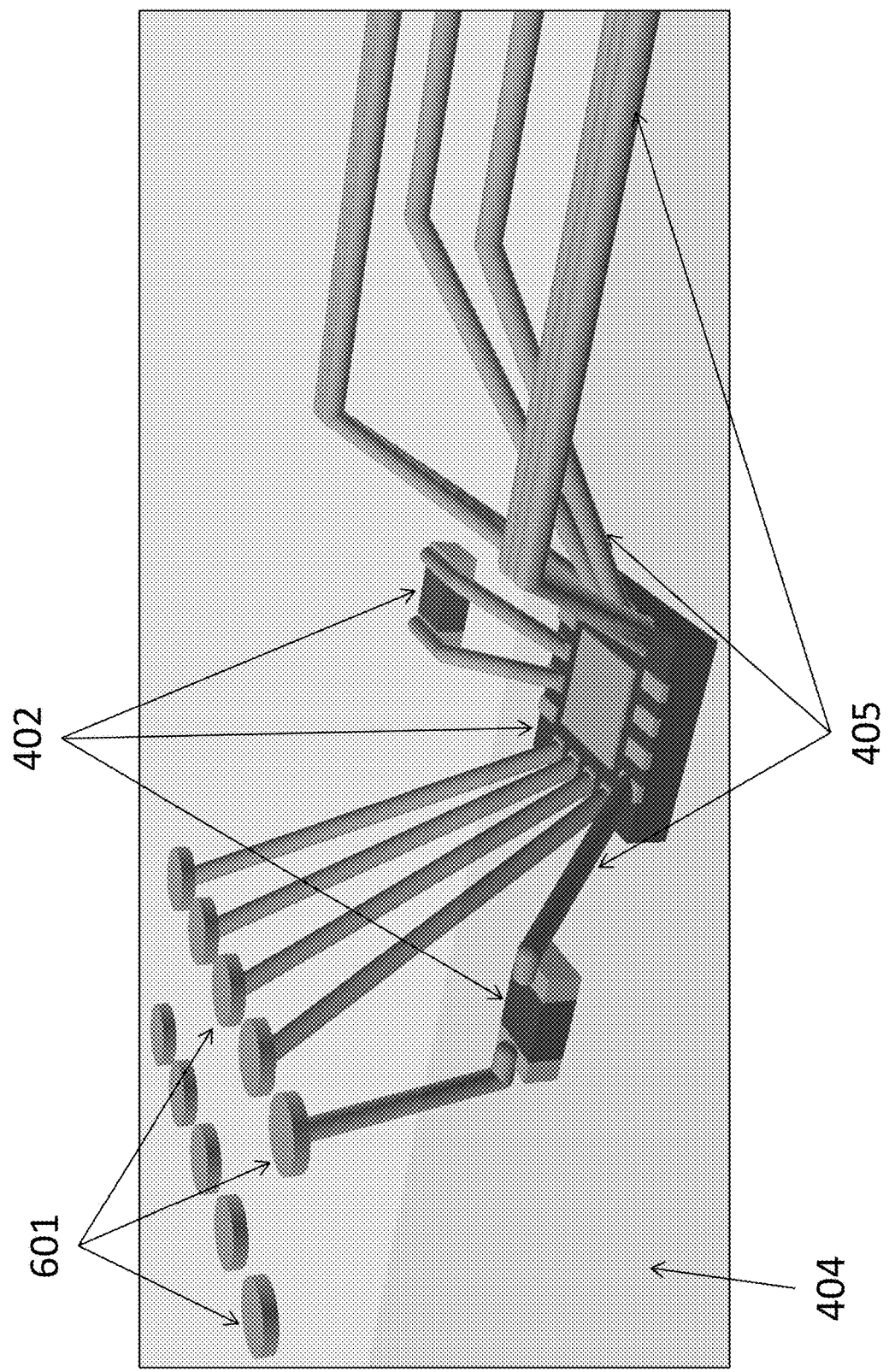

At the next step processing unit controls stepper motor and starts extrusion of non-conductive material on building platform 201. Processing unit will extrude non-conductive material with cavities 403 for components 402 until depth of cavity will reach depth of component to be placed here. After finishing this layer, the processing unit will control pick-and-place mechanism 303 and pick and place the needed component 402 to the component cavity 403 as depicted on FIG. 4a and FIG. 4b. At next step the invented apparatus extrude one more layer of non-conductive material, use flux dispenser 304 and dispense flux at contacts of components 402. After this process the apparatus extrude conductive material to the contacts forming the signal traces.

Example of manufacturing steps are depicted on FIGS. 7a, 7b, 7c, 7d, 7e, 7f, 7g, and 7h. Invented apparatus extrudes layers of non-conductive material until it reaches top level of next component 402 to be placed. Then cavity is filled with component 402 by pick-and place mechanism 303. Flux is used on components contacts to allow conductive material to be soldered reliably. Contacts to the components are made on top, while component is upside-down as on FIG. 7d. Then the process repeats adding layer by layer of non-conductive material and conductive material forming traces.

Figure 8A:
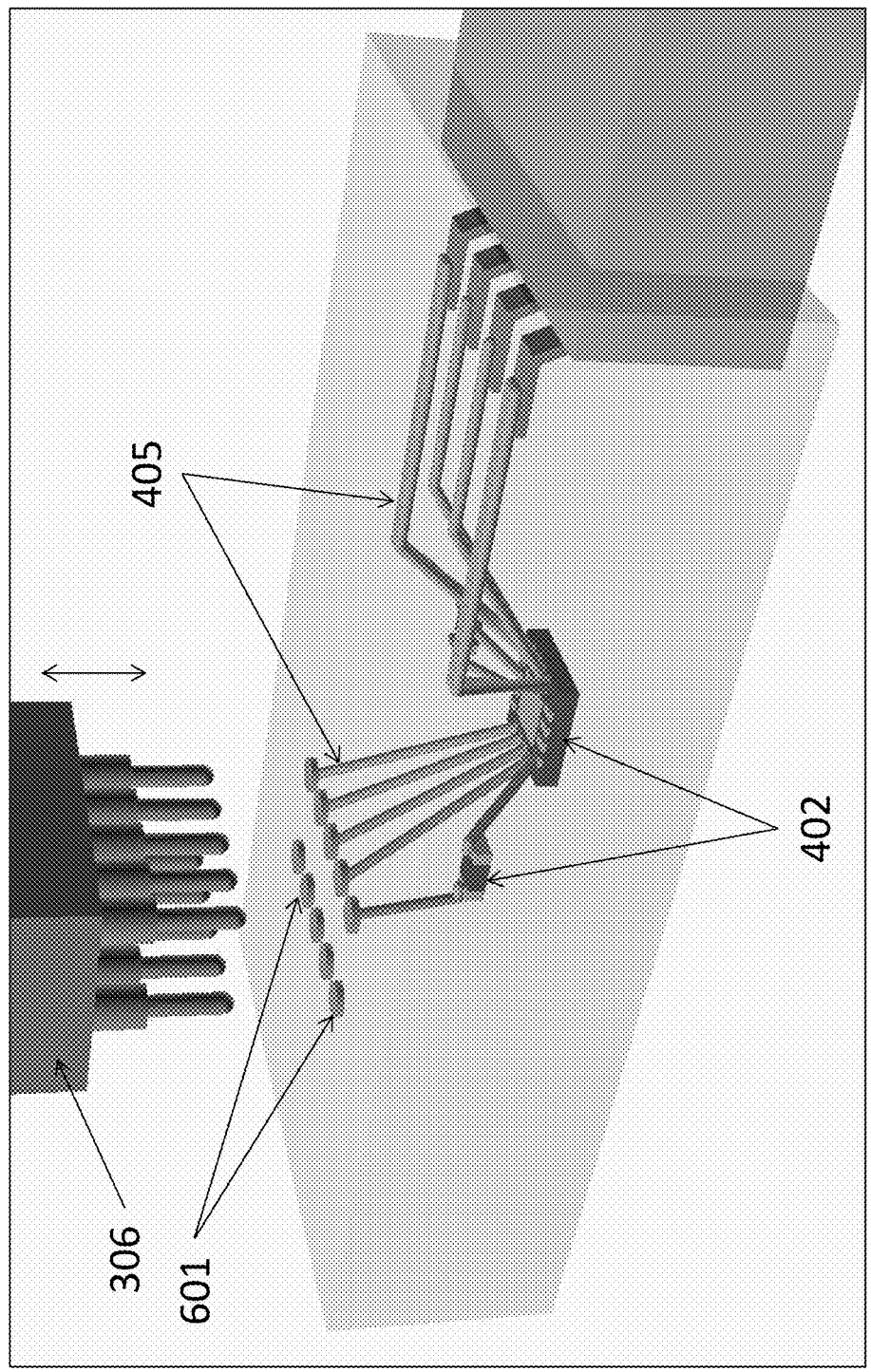
FIG. 8a shows electronic device with all signal traces and components manufactured, but not finished yet. The last extruded layer contains arranged test-points so they are exposed for testing/programming with testing/programming head.
Figure 8B:
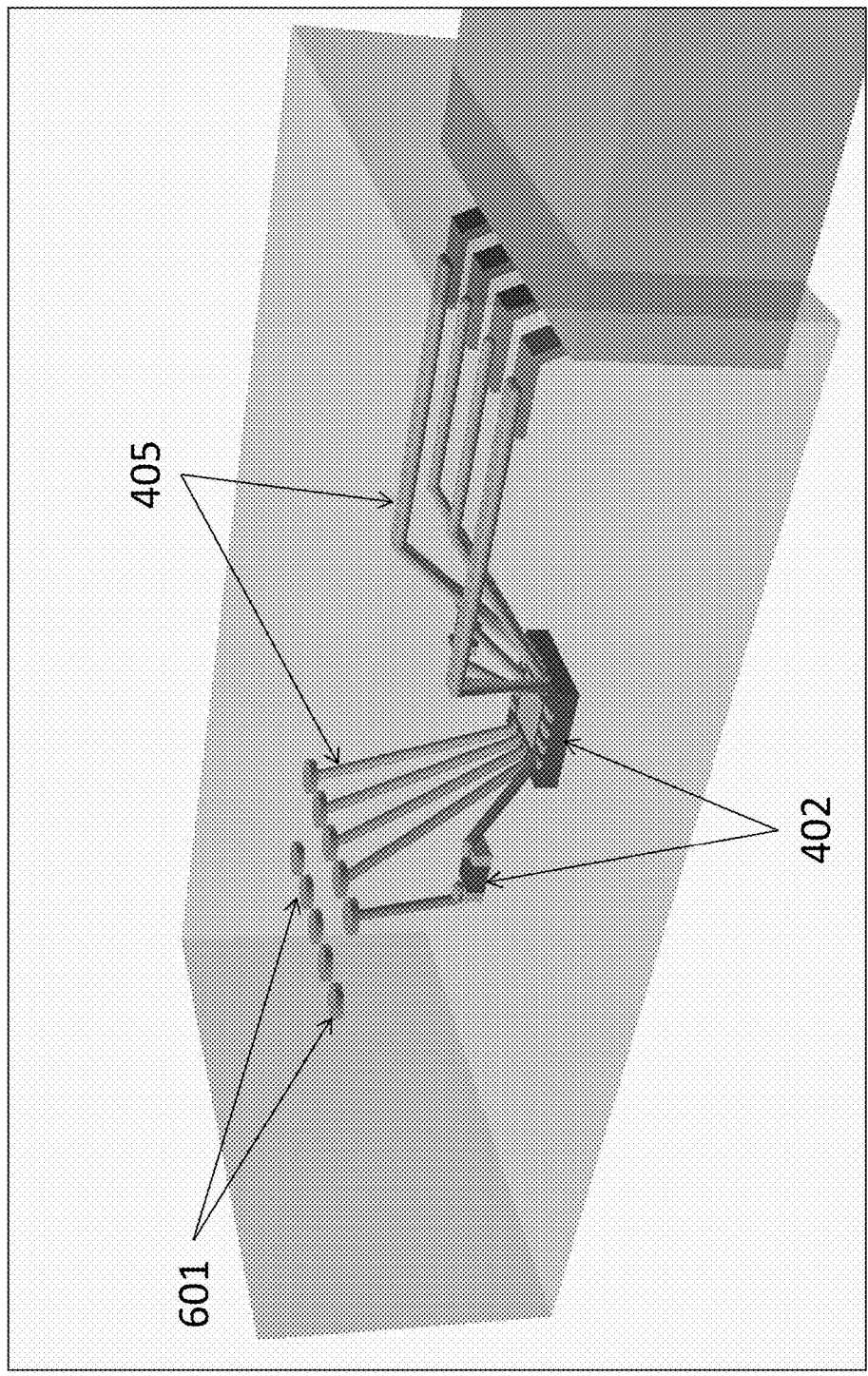
FIG. 8b shows electronic device completely manufactured. The arranged test-points are hidden under upper layers of the manufactured electronic device.
Figure 9:
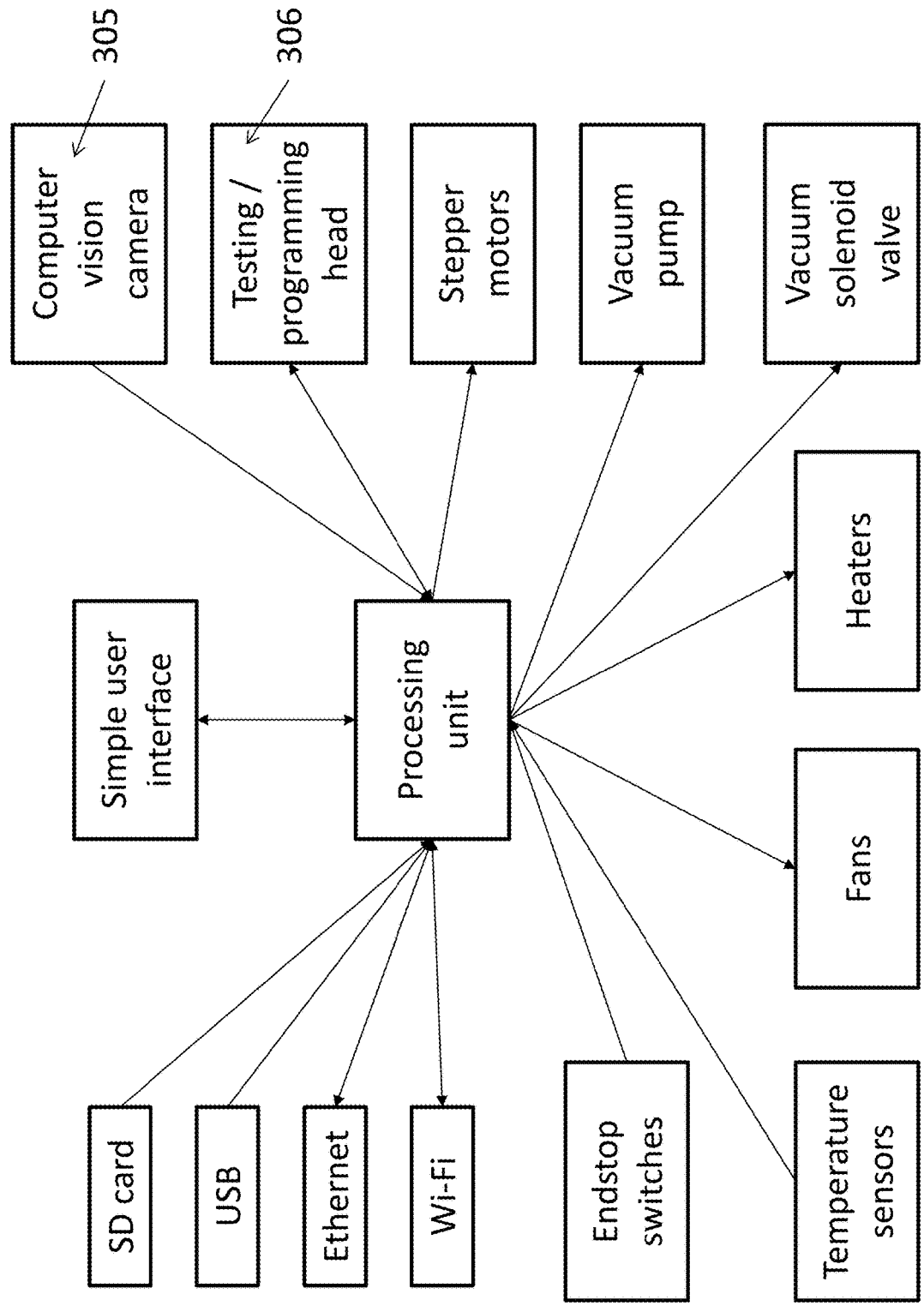
FIG. 9 depicts exemplary logical diagram of connections in the invented apparatus.

When arranged test-points 601 are extruded completely—programming/testing can occur. For this purpose testing/programming head 306 is used as depicted on FIG. 8a. It has spring-loaded contacts (pogo pins) that match pattern of arranged test-points 601. Processing unit place moving head 300 so the testing/programming head 306 is above arranged test-points 601. Then using separate movement it moves down to make contact with arranged test-points 601. Programming or testing occurs while testing/programming head 306 is pressed against arranged test-points 601. After programming or testing is finished testing/programming head 306 is lifted. For the designs with hidden arranged test-points 601 the extrusion process continues with non-conductive material until arranged test-points become hidden under layers of non-conductive material as on FIG. 8b.

The melting temperature of common solder used for electronics manufacturing is 180 C to 230 C. ABS plastic is usually extruded at around 230 C and PLA at around 190 C. So the extruder temperature for conductive and non-conductive material will have no significant difference in temperature. However the power of extruder heater will be higher for conductive material extruder 301, because of difference in latent heat of fusion and specific heat for solder and plastic.

Non-conductive material could be any thermoplastic suitable for 3D printing. Transparent plastic will provide better visualization of internal structure of the electronic device, while opaque plastic can be used to hide the internal structure.

In one embodiment non-conductive material is an epoxy that cures by air contact or by UV light.

Popular size of plastic filament is 1.75 mm, so it is convenient to use solder wire of similar size (1.5-1.75 mm). Most common solder wire available on market contain flux core, this flux will be boiling inside extruder heater preventing from continuous extrusion of solder. Flux has to be applied separately, that is why separate flux dispenser 304 is added to moving head 300. The proportions of tin solder wire alloy should be adjusted for optimal melting temperature. Example 95% tin and 5% antimony will have melting temperature at 238 C; 96.5% tin, 3% silver, and 0.5% copper will have melting temperature of 216 C. Leaded solder usually have lower temperature down to 180 C.

Operating temperature range of manufactured electronics is limited by maximum temperature of materials which is melting temperature of solder material and glass transition temperature of thermoplastic material. For example, glass transition temperature of ABS is around 105 C, so the manufactured electronic device will have its maximum operating temperature below 105 C. For PLA glass transition temperature is around 65 C, so electronics fabricated with PLA will have maximum operating temperature below 65 C. With additional support or rugged housings the fabricated electronic devices might have higher operating temperature. Different solder or thermoplastic could be used to increase maximum temperature.

Most common material for PCBs is FR-4 substrate, which is typically rated up to 130 C.

Thermal stress on components 402 during manufacturing with invented method is of an order of reflow soldering or less, because soldering for each contact can be separated in time, letting the component to cool, in oppose to reflow soldering where temperature of component raises completely.

Maximum melting temperature for extruded material is limited by maximum amount of thermal stress allowed for the electronic components. With regular reflow soldering profile components are reaching temperature of 230-250 C for 30-90 seconds. Since the extrusion of conductive and non-conductive material can be done much faster than 30-90 seconds—material with higher than 230-250 C melting temperature can be used.

Manufactured electronic device 600 might be placed inside a regular enclosure, overmolded or used as is.

The invention claimed is:

1. A method for manufacturing electronics, comprising the steps of:
    extruding melted non-conductive material in shape of continuous line segments to form a layered 3D shape and cavities;
    embedding electronic components upside down in the cavities such that component contacts are on top surface;
    applying soldering flux to the contacts of electronic components to provide reliable interconnection between component contacts and conductive material; and
    extruding melted conductive material in shape of continuous line segments to provide electrical connection to component contacts and to form layered 3D signal traces.

2. The method of claim 1 wherein the conductive material is an electric soldering wire without a flux core.

3. The method of claim 1 wherein the non-conductive material is a thermoplastic.

4. The method of claim 1 further comprising interrupting extrusion process at some pre-arranged layer number, testing of partially printed circuit with floating probe, and continuing extrusion process.

5. The method of claim 1 further comprising interrupting extrusion process at some pre-arranged layer number, in-circuit programming of already embedded electronic components, and continuing extrusion process.

6. A method for manufacturing electronics, comprising the steps of:
    extruding melted non-conductive material in shape of continuous line segments to form a layered 3D shape and cavities;
    placing electronic components into prepared cavities with its contacts facing up;
    extruding melted conductive material in shape of continuous line segments to provide electrical connection to component contacts and to form layered 3D signal traces; and interrupting extrusion process at some pre-arranged layer number, testing of partially printed circuit with floating probe, and continuing extrusion process.

7. The method of claim 6 further comprising the step of applying soldering flux to the contacts of electronic components to provide reliable interconnection between component contacts and conductive material.

8. The method of claim 6 wherein the conductive material is an electric soldering wire without a flux core.

9. The method of claim 6 wherein the non-conductive material is a thermoplastic.

10. The method of claim 6 further comprising interrupting extrusion process at some pre-arranged layer number, in-circuit programming of already embedded electronic components, and continuing extrusion process.

* * * * *